United States Patent [19]

Chapple-Sokol et al.

[11] Patent Number: 5,268,069

[45] Date of Patent: Dec. 7, 1993

[54] SAFE METHOD FOR ETCHING SILICON DIOXIDE

[75] Inventors: Jonathan D. Chapple-Sokol, Poughkeepsie; Richard A. Conti, Mount Kisco; David E. Kotecki, Hopewell Junction; Andrew H. Simon, Fishkill; Manu Tejwani, Yorktown Heights, all of N.Y.

[73] Assignee: International Business Machines Corporation, Armonk, N.Y.

[21] Appl. No.: 895,493

[22] Filed: Jun. 8, 1992

Related U.S. Application Data

[63] Continuation-in-part of Ser. No. 783,857, Oct. 28, 1991, abandoned.

[51] Int. Cl.$^5$ ............................................. H01L 21/00
[52] U.S. Cl. ................................. 156/646; 156/653; 156/657; 156/662; 134/3; 134/31
[58] Field of Search ............... 156/646, 657, 662, 653; 134/31, 3

[56] References Cited

U.S. PATENT DOCUMENTS

| | | |
|---|---|---|
| 273,588 | 3/1883 | Nienstadt . |
| 276,893 | 5/1883 | Schulze-Berg . |
| 276,896 | 5/1883 | Schulze-Berg . |
| 382,318 | 5/1888 | Nienstadt . |
| 1,470,772 | 10/1923 | Simon . |
| 3,979,241 | 9/1976 | Maeda et al. . |
| 4,459,173 | 7/1984 | Peters . |
| 4,749,440 | 6/1988 | Blackwood et al. . |
| 4,761,244 | 8/1988 | Scardera et al. . |
| 5,030,319 | 9/1991 | Nishino et al. . |

OTHER PUBLICATIONS

1989 Dry Process Symposium IV-2, Nishino et al.; 90-92; (1989).

*Primary Examiner*—Thi Dang
*Attorney, Agent, or Firm*—Whitham & Marhoefer

[57] ABSTRACT

Anhydrous ammonium fluoride is used as a safe source of hydrogen fluoride for etching native or other silicon dioxide layers from silicon substrates. Heating the anhydrous ammonium fluoride above its sublimation temperature results in the generation of hydrogen fluoride gas which etches the silicon dioxide. Controlled amounts of water vapor are used during the etch reaction to ensure complete etching of the thin oxide layers down to within hundredths of a monolayer and to achieve precise etch rate control.

17 Claims, No Drawings

SAFE METHOD FOR ETCHING SILICON DIOXIDE

CROSS-REFERENCE TO RELATED PATENT APPLICATIONS

This patent application is a continuation-in-part (CIP) patent application of the co-pending patent application having Ser. No. 07/783,857 which was filed Oct. 28, 1991, now abandoned, and that patent application is herein incorporated by reference.

BACKGROUND OF THE INVENTION

1. Field of the Invention

The present invention is generally related to a method of etching or cleaning off native or other silicon dioxide ($SiO_2$) from the surface of a silicon (Si) substrate and, more particularly, to a safe method of etching or cleaning off $SiO_2$ which employs anhydrous ammonium fluoride ($NH_4F$) as a source of hydrofluoric acid (HF) which is used for etching or cleaning off the $SiO_2$.

2. Description of the Prior Art

If the surface of a silicon substrate is exposed to ambient air, a native $SiO_2$ layer forms on its surface. The native $SiO_2$ layer presents certain manufacturing difficulties since many semiconductor processes, such as low-temperature epitaxy, polysilicon deposition, and silicidation, require the silicon wafer surface to be free of all native $SiO_2$. Over the years, many different processes for etching or cleaning off the native $SiO_2$ from Si surfaces have been developed. One of the most commonly used techniques for etching $SiO_2$ is to expose the substrate to HF (wet or dry). However, the use of liquid or vapor HF has major drawbacks for the semiconductor manufacturer because it is both highly toxic and highly corrosive. The high toxicity of HF requires the semiconductor manufacturer to implement safety procedures and devices which assure that personnel and the environment are not injured by the HF gas. The high corrosiveness of HF requires the semiconductor manufacturer to utilize non-corrosive storage containers and non-corrosive tubing for delivering the HF gas to a cleaning or etch chamber, and this type of equipment is generally more expensive than containers and tubing that do not have non-corrosive properties.

In U.S. Pat. No. 5,030,319 to Nishino et al. and in the article to Nishino et al., 1989 *Dry Process Symposium IV*-2, 90-92 (1989), a method of selectively etching native $SiO_2$ from a silicon substrate is disclosed which employs the fluorine atoms and nitrogen hydrides produced by an $NH_3$ and $NF_3$ microwave discharge. In the Nishino et al. etch process, a film of $(NH_4)_2SiF_6$ is formed by condensation on the surface of the substrate by the reaction of $NH_4^+$ and $F^-$ with the polarized Si atom of the ionic $SiO_2$ species. For film formation to occur, the substrate temperature must be maintained below 100° C., and is preferably performed at room temperature. After film formation, the substrate is heated above 100° C. and the $(NH_4)_2SiF_6$ film vaporizes to leave an oxygen free silicon surface.

The Nishino et al. etch process is not ideal because it requires the transport of corrosive and toxic gases into a reaction chamber; therefore, the cost of non-corrosive tubing and storage chambers as well as the requirement of increased safety procedures are not avoided by the Nishino et al. etch process. Moreover, the Nishino et al. process imposes timing and temperature control parameters on a semiconductor manufacturer since the wafer temperature must first be maintained below 100° C. to allow an etching film to form on the substrate surface, and subsequently, the substrate must be heated above 100° C. to remove the etch products. Nishino et al. acknowledge that if the temperature is kept above 100° C. initially, film deposition does not take place and no $SiO_2$ etching occurs.

SUMMARY OF THE INVENTION

It is therefore an object of this invention to provide a safe and non-corrosive method of removing native or other $SiO_2$ from silicon surfaces which employs anhydrous $NH_4F$ as a source of HF.

It is another object of this invention to provide a method of controlling the $SiO_2$ etch rate with HF by regulating the amount of adsorbed water ($H_2O$) present on the $SiO_2$.

According to the invention, anhydrous $NH_4F$ is used as a safe source of HF to etch the native $SiO_2$ from silicon surfaces. A supply of anhydrous $NH_4F$ is provided either in the etching or cleaning chamber in which the silicon substrates are positioned or is provided in a chamber which is in close proximity to the etching or cleaning chamber and is connected therewith. Upon heating, anhydrous $NH_4F$ sublimates to form HF gas and $NH_3$ gas. The HF gas then etches off the native or other $SiO_2$ on the surface of the silicon substrate.

Controlled amounts of water vapor are used during the etch reaction to ensure complete etching of the thin oxide layers down to within hundredths of a monolayer and to achieve precise etch rate control. Trace quantities of water aid in initiating the $SiO_2$ etch reaction with HF and anhydrous HF vapor alone cannot be used to achieve complete etching of thin native or chemical oxides on patterned substrates where the rest of the pattern is bulk or thick oxide (see, McIntosh et al., *J. of Elect. Mat.*, 21:57-60 (1992)). Therefore, precise quantities of water vapor are advantageously metered into the etch chamber prior to or during $NH_4F$ sublimation for $SiO_2$ etching. Water which is not adsorbed on the $SiO_2$ surface is either pumped out of the etch chamber or is purged out by flowing dry inert gas over the $SiO_2$ surface. In addition, water vapor is a by-product of the $SiO_2$ etch reaction itself. Hence, the etch rate of subsequent oxide etches can vary from the first oxide etch if the quantity of water vapor within the etch chamber is not controlled. Therefore, periodic (e.g., after each $SiO_2$ etch) water vapor evacuation or purging from the etch chamber assures that the etch rate remains controlled.

DETAILED DESCRIPTION OF THE PREFERRED EMBODIMENTS OF THE INVENTION

Anhydrous $NH_4F$ sublimates at temperatures above 100° C. and at pressures on the order of one to ten Torr according to the following reaction:

$$NH_4F_{(c)} \rightarrow HF_{(g)} + NH_{3(g)}$$

Anhydrous $NH_4F$ is intrinsically safer than gaseous or aqueous HF because it absorbs water readily and is converted to a less reactive form, aqueous $NH_4F$, upon exposure to air. Aqueous $NH_4F$ is used in making buffered HF solutions and does not form gaseous HF upon heating or evaporation. Anhydrous $NH_4F$ is commercially available from a variety of sources including Aldrich Chemical, Sigma Chemical, and Alfa Chemical.

In the present invention, anhydrous $NH_4F$ is provided either in the etching or cleaning chamber in which the silicon substrates having $SiO_2$ are positioned or is provided in a chamber which is in close proximity to the etching or cleaning chamber and is connected therewith. The anhydrous $NH_4F$ may be provided in an open or valved ampoule, container or the like. Upon heating the ampoule or container of anhydrous $NH_4F$ above the sublimating temperature, HF gas is generated and the HF gas is used to etch the $SiO_2$ from the surface of the silicon substrate. It is possible that the $NH_3$ gas generated during the sublimation will also assist in the etching by acting as an electron donor in the reaction. Control of the delivery of the HF gas for etching $SiO_2$ can be accomplished by regulating the temperature to which the ampoule or container of anhydrous $NH_4F$ is exposed (i.e., modulating the temperature above and below sublimation temperature as HF gas is required, or similar processes). Hence, this invention avoids the problems associated with the handling and transport of HF gas by using anhydrous $NH_4F$ as a source of HF gas in the same etch chamber as the silicon substrate or in a chamber in close proximity with and connected to the etch chamber.

In a test experiment, a silicon substrate with a thermally grown $SiO_2$ layer was placed adjacent a container of anhydrous $NH_4F$. The substrate was maintained at ambient temperature, but the anhydrous $NH_4F$ was heated to a temperature of 200° C. such that it sublimated to form HF gas and $NH_3$ gas. The $SiO_2$ on the substrate surface was observed to be etched at a rate of approximately 30Å/min. Similar results would be achieved when the substrate is maintained at an elevated temperature above the temperature of $NH_4F$ sublimation.

Water vapor is advantageously added to the etch chamber to assist in the etching of the $SiO_2$; however, care must be taken to prevent the anhydrous $NH_4F$ from being converted to its aqueous form prior to generation of the HF gas.

Controlled amounts of water vapor are used during the etch reaction to ensure complete etching of the thin oxide layers down to within hundredths of a monolayer (a level suitable for epitaxy) and to achieve precise etch rate control. Trace quantities of water aid in initiating the $SiO_2$ etch reaction with HF. Moreover, McIntosh et al., *J. of Elect. Mat.*, 21:57–60 (1992), show that anhydrous HF vapor alone cannot be used to achieve complete etching of thin native or chemical oxides on patterned substrates where the rest of the pattern is bulk or thick oxide. Therefore, precise quantities of water vapor are advantageously metered into the etch chamber prior to or during $NH_4F$ sublimation to HF and $NH_3$ for $SiO_2$ etching. Water which is not adsorbed on the $SiO_2$ surface is either pumped out of the etch chamber or is purged out by flowing dry inert gas over the $SiO_2$ surface.

Water vapor is a by-product of the $SiO_2$ etch reaction itself. Hence, the etch rate of subsequent oxide etches can vary from the first oxide etch if the quantity of water vapor within the etch chamber is not controlled. Therefore, periodic (e.g., after each $SiO_2$ etch) water vapor evacuation or purging from the etch chamber assures that the etch rate remains controlled.

For thick oxide films, a repetitive process which includes the steps of exposure to water vapor, purge or evacuation of excess water vapor, and $NH_4F$ sublimation for HF etching of $SiO_2$ allows for fine control over the etch rate as well as ensures complete etching down to hundredths of a monolayer levels of oxide. This degree of etching provides an adequate pre-clean for subsequent processing steps including epitaxy and polysilicon deposition. Preferably, any subsequent processing steps will be performed in the same etch chamber or another chamber vacuum connected to the etch chamber immediately after etching the $SiO_2$ layer such that regrowth of native $SiO_2$ is prevented.

While the invention has been described in terms of its preferred embodiments, those skilled in the art will recognize that the invention can be practiced with modification within the spirit and scope of the appended claims.

Having thus described our invention, what we claim as new and desire to secure by Letters Patent is as follows:

1. A method of etching or cleaning of silicon dioxide, comprising:
    placing a silicon substrate having a silicon dioxide layer formed thereon into an etch chamber;
    supplying a quantity of anhydrous ammonium fluoride in said etch chamber or in a chamber in close proximity to said etch chamber and connected therewith;
    heating said anhydrous ammonium fluoride above a temperature of sublimation for said anhydrous ammonium fluoride to create a gaseous specie which is transported to and etches said silicon dioxide on said silicon substrate; and
    preventing formation of an ammonium fluoride film on said silicon dioxide on said silicon substrate during said heating step.

2. A method as recited in claim 1 wherein said gaseous specie created during said heating step is hydrogen fluoride.

3. A method as recited in claim 1 wherein said heating step heats said anhydrous ammonium fluoride to 100° C. or more.

4. A method as recited in claim 1 further comprising the step of maintaining said silicon substrate at a temperature below said temperature required for sublimation of said anhydrous ammonium fluoride.

5. A method as recited in claim 1 further comprising the step of maintaining said silicon substrate at a temperature above said temperature required for sublimation of said anhydrous ammonium fluoride.

6. A method as recited in claim 1 further comprises the step of modulating the temperature of said anhydrous ammonium fluoride above and below said sublimation temperature, whereby the delivery of said gaseous specie is regulated.

7. A method as recited in claim 1 further comprising the step of depositing a layer of material on said silicon substrate immediately after said layer of silicon dioxide has been removed and before any silicon dioxide regrowth.

8. A method as recited in claim 1 further comprising the step of providing quantities of water vapor within said etch chamber.

9. A method as recited in claim 8 further comprising the step of removing quantities of water vapor from within said etch chamber.

10. A method as recited in claim 1 further comprising the step of removing quantities of water vapor from within said etch chamber.

11. A method of etching or cleaning of silicon dioxide, consisting of:
   placing a silicon substrate having a silicon dioxide layer formed thereon into an etch chamber;
   supplying a quantity of anhydrous ammonium fluoride in said etch chamber or in a chamber in close proximity to said etch chamber and connected therewith;
   heating said anhydrous ammonium fluoride above a temperature of sublimation for said anhydrous ammonium fluoride to create a gaseous specie which is transported to and etches said silicon dioxide on said silicon substrate; and
   preventing formation of an ammonium fluoride film on said silicon dioxide on said silicon substrate during said heating step.

12. A method of etching or cleaning of silicon dioxide, comprising:
   placing a silicon substrate having a silicon dioxide layer formed thereon into an etch chamber;
   providing quantities of water vapor within said etch chamber;
   supplying a quantity of anhydrous ammonium fluoride in said etch chamber or in a chamber in close proximity to said etch chamber and connected therewith; and
   heating said anhydrous ammonium fluoride above a temperature of sublimation for said anhydrous ammonium fluoride to create gaseous specie which is transported to and etches said silicon dioxide on said silicon substrate.

13. A method as recited in claim 12 wherein said step of providing quantities of water is performed prior to said step of heating said anhydrous ammonium fluoride.

14. A method as recited in claim 12 wherein said step of providing quantities of water is performed during said step of heating said anhydrous ammonium fluoride.

15. A method of etching or cleaning of silicon dioxide, comprising:
   placing a silicon substrate having a silicon dioxide layer formed thereon into an etch chamber;
   removing quantities of water vapor from within said etch chamber;
   supplying a quantity of anhydrous ammonium fluoride in said etch chamber or in a chamber in close proximity to said etch chamber and connected therewith; and
   heating said anhydrous ammonium fluoride above a temperature of sublimation for said anhydrous ammonium fluoride to create gaseous specie which is transported to and etches said silicon dioxide on said silicon substrate.

16. A method as recited in claim 15 wherein said step of removing quantities of water from within said etch chamber is repeated periodically.

17. A method of etching or cleaning of silicon dioxide, comprising:
   placing a silicon substrate having a silicon dioxide layer formed thereon into an etch chamber;
   providing quantities of water within said etch chamber;
   supplying a quantity of anhydrous ammonium fluoride in said etch chamber or in a chamber in close proximity to said etch chamber and connected therewith;
   heating said anhydrous ammonium fluoride above a temperature of sublimation for said anhydrous ammonium fluoride to create gaseous specie which is transported to and etches said silicon dioxide on said silicon substrate; and
   removing quantities of water vapor from within said etch chamber.

* * * * *